(12) United States Patent
Shako et al.

(10) Patent No.: US 7,830,979 B2
(45) Date of Patent: Nov. 9, 2010

(54) DISTORTION COMPENSATION AMPLIFICATION DEVICE AND CORRECTION METHOD

(75) Inventors: Hideharu Shako, Kawasaki (JP); Takeshi Ohba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/396,993

(22) Filed: Mar. 3, 2009

(65) Prior Publication Data

US 2009/0224828 A1 Sep. 10, 2009

(30) Foreign Application Priority Data

Mar. 6, 2008 (JP) .............................. 2008-055944

(51) Int. Cl.
*H04L 25/49* (2006.01)
(52) U.S. Cl. ...................................... 375/296; 375/297
(58) Field of Classification Search ................. 375/296, 375/297, 285, 295; 332/107, 123, 159, 106, 332/124, 125, 160; 455/114.3, 114.2
See application file for complete search history.

(56) References Cited

U.S. PATENT DOCUMENTS

| | | | |
|---|---|---|---|
| 5,903,823 A | 5/1999 | Moriyama et al. | |
| 6,907,085 B2 * | 6/2005 | Kubo et al. | 375/285 |
| 7,529,313 B2 * | 5/2009 | Naito et al. | 375/271 |
| 7,539,268 B2 * | 5/2009 | Fechtel | 375/296 |
| 2004/0165678 A1 * | 8/2004 | Nadiri | 375/296 |
| 2005/0085199 A1 * | 4/2005 | Khan et al. | 455/114.3 |
| 2007/0286307 A1 * | 12/2007 | Hayashi et al. | 375/297 |

FOREIGN PATENT DOCUMENTS

| | | |
|---|---|---|
| JP | 09083587 | 3/1997 |
| JP | 10065570 | 3/1998 |
| JP | 2004328342 | 11/2004 |

* cited by examiner

*Primary Examiner*—Tesfaldet Bocure
(74) *Attorney, Agent, or Firm*—Hanify & King, P.C.

(57) ABSTRACT

A distortion compensation amplification device which supplies a transmission signal while a distortion of the amplified transmission signal is compensated, the distortion compensation amplification device including a correction unit which corrects a carrier leak and an image of the transmission signal based on a correction value. The distortion compensation amplification device includes a modulation unit which modulates the transmission signal supplied from the correction unit. The distortion compensation amplification device includes a correction value calculating unit which calculates the correction value based on the transmission signal supplied from the modulation unit. The distortion compensation amplification device includes a test signal output unit which supplies a test signal to the correction unit in order to calculate the correction value of the correction value calculating unit when the transmission signal is not transmitted.

9 Claims, 9 Drawing Sheets

DISTORTION COMPENSATION AMPLIFICATION DEVICE AND CORRECTION METHOD

CROSS-REFERENCE TO RELATED APPLICATION(S)

This application is based upon and claims the benefit of priority of the prior Japanese Patent Application No. 2008-55944, filed Mar. 6, 2008, the entire contents of which are incorporated herein by reference.

BACKGROUND OF THE INVENTION

1. Field of the Invention

The present invention relates to a distortion compensation amplification device and a correction method.

2. Description of the Related Art

Recently, digitalized high-efficiency transmission has been frequently adopted in wireless communication. In the case where multi-level phase shift keying is applied to the wireless communication, there is a demand for a technique in which an amplifying characteristic of a transmission power amplifier is linearized to suppress non-linear distortion on the transmission side, such as a base transceiver station, thereby reducing an adjacent channel leak power. A distortion compensation amplification device is one of the devices which compensates for the distortion of the amplifier.

In the direct modulation type distortion compensation amplification device, a carrier leak and an image are generated in the transmission data by an offset of the transmission data in a converter or incomplete amplitude. Therefore, the distortion compensation amplification device includes a correction unit which removes the carrier leak or image generated in the converter. The correction unit feeds back a signal supplied from the converter, calculates a correction value for correcting the offset or amplitude of the transmission data, corrects the transmission data using the calculated correction value, and supplies the corrected transmission data to the subsequent converter. Therefore, the carrier leak and the image are removed in the output of the converter (for example, see Japanese Laid-Open Patent Publication No. 09-83587). There exists a wireless apparatus in which, in order to rapidly end distortion compensation processing, the power of the amplifier is turned off and test data for offset detection is supplied from a control unit to perform offset correction (for example, see Japanese Laid-Open Patent Publication No. 10-65570).

A need arises for a distortion compensation amplification device which can optimally and flexibly calculate the correction value in order to remove the carrier leak and the image, and a correction method.

SUMMARY

In order to optimally remove the carrier leak and image of the actual signal wirelessly transmitted to the terminal, desirably the correction value is calculated using not the test signal, but the actually transmitted signal. Even if the signal used to calculate the correction is not actually transmitted, desirably the correction value can be calculated such that the transmission of the radio signal can rapidly be started.

According to an aspect of the embodiments, a distortion compensation amplification device which supplies a transmission signal while a distortion of the amplified transmission signal is compensated, the distortion compensation amplification device including a correction unit which corrects a carrier leak and an image of the transmission signal based on a correction value. The distortion compensation amplification device includes a modulation unit which modulates the transmission signal supplied from the correction unit. The distortion compensation amplification device includes a correction value calculating unit which calculates the correction value based on the transmission signal supplied from the modulation unit. The distortion compensation amplification device includes a test signal output unit which supplies a test signal to the correction unit in order to calculate the correction value of the correction value calculating unit when the transmission signal is not transmitted.

The object and advantages of the embodiments will be realized and attained by means of the elements and combinations particularly pointed out in the claims.

It is to be understood that both the foregoing general description and the following detailed description are exemplary and explanatory only and are not restrictive of the invention, as claimed.

DESCRIPTION OF EMBODIMENTS

In order to optimally remove the carrier leak and image of the actual signal wirelessly transmitted to the terminal, desirably the correction value is calculated using not the test signal, but the actually transmitted signal. Even if the signal used to calculate the correction is not actually transmitted, desirably the correction value can be calculated such that the transmission of the radio signal can rapidly be started.

Figure 1:
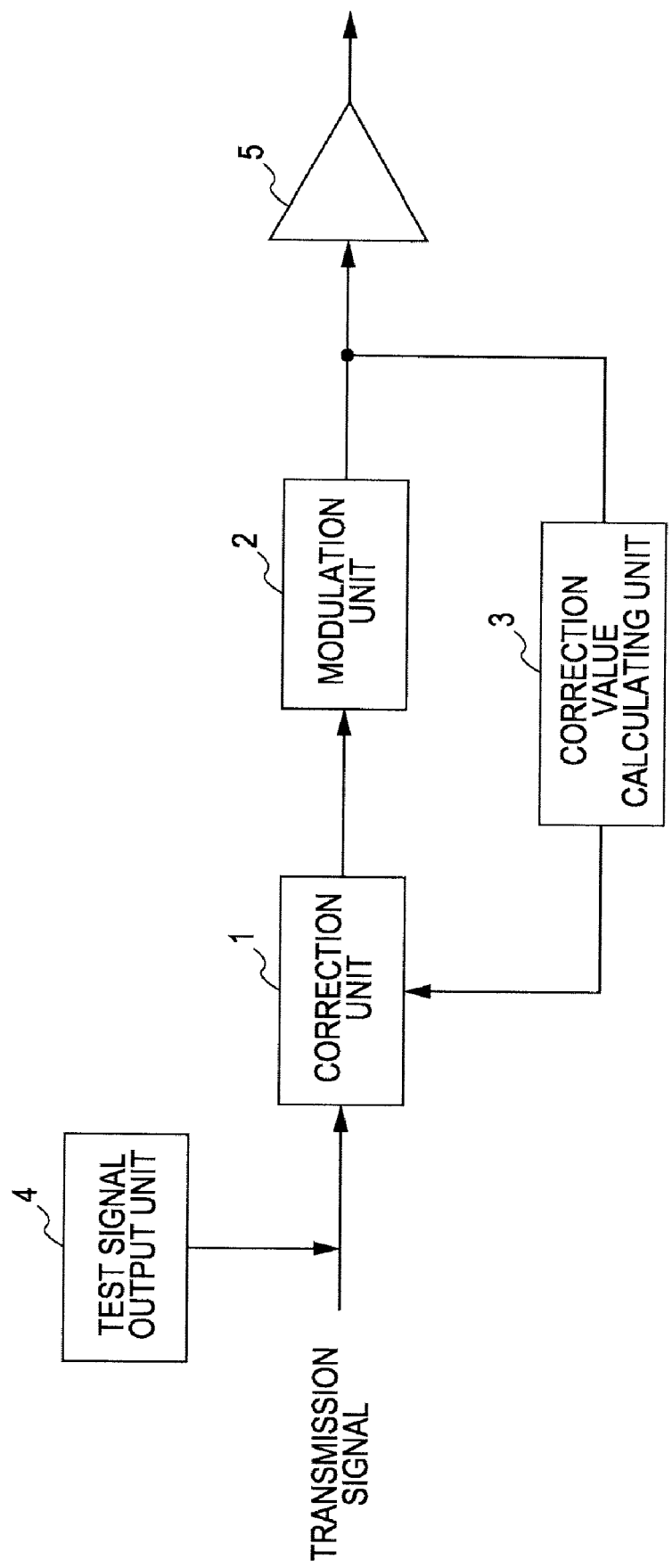
FIG. 1 is a schematic diagram illustrating a distortion compensation amplification device.

FIG. 1 is a schematic diagram illustrating a distortion compensation amplification device. The distortion compensation amplification device of FIG. 1 is mounted on a terminal such as a portable telephone or a base transceiver station which conducts wireless communication. For example, the distortion compensation amplification device applied to the base transceiver station compensates for distortion of a signal wirelessly transmitted to the terminal while amplifying the signal, and corrects the signal so as to remove a carrier leak and an image which are generated in the signal.

Although a distortion compensation amplification device applied to a base transceiver station will be described below, the distortion compensation amplification device can also be applied to a terminal and the like.

Referring to FIG. 1, the distortion compensation amplification device includes a correction unit 1, a modulation unit 2, a correction value calculating unit 3, a test signal output unit 4, and an amplifying unit 5. Although not illustrated in FIG. 1, the distortion compensation amplification device includes a distortion compensation processing unit which feeds back an output of the amplifying unit 5 to compensate the distortion of the amplifying unit 5.

The correction unit 1 corrects a carrier leak and an image of a transmission signal based on a correction value calculated by the correction value calculating unit 3. The transmission signal is transmitted from an upper-level apparatus such as an RNC (Radio Network Control), which controls the base transceiver station, and is wirelessly transmitted to the terminal.

The modulation unit 2 modulates the transmission signal supplied from the correction unit 1. In the modulation unit 2, the carrier leak and the image are generated by an offset of the transmission signal or incomplete amplitude. The correction unit 1 corrects the transmission signal in order to remove the carrier leak and image which are generated in the modulation unit 2, and supplies the corrected transmission signal to the modulation unit 2.

The correction value calculating unit 3 calculates a correction value based on the transmission signal supplied from the modulation unit 2. The correction value is used to correct the carrier leak and image of the correction unit 1.

In the case where the upper-level apparatus does not provide a transmission signal, the test signal output unit 4 supplies a test signal to the correction unit 1 in order to calculate the correction value of the correction value calculating unit 3. That is, in the case where the upper-level apparatus provides a transmission signal that is wirelessly transmitted to the terminal, the correction value calculating unit 3 calculates the correction value from the transmission signal. In the case where the upper-level apparatus does not provide a transmission signal that is wirelessly transmitted to the terminal, the correction value calculating unit 3 calculates the correction value from the test signal.

The amplifying unit 5 amplifies the transmission signal supplied from the modulation unit 2. The amplifying unit 5 can function to decrease the output amplitude to zero so that an unnecessary radio signal is not actually transmitted to the terminal while the correction value calculating unit 3 calculates the correction value.

Thus, the distortion compensation amplification device calculates the correction value to remove the carrier leak and image based on an actual transmission signal transmitted from the upper-level apparatus. In the distortion compensation amplification device, when the upper-level apparatus does not provide a transmission signal, the test signal output unit 4 supplies a test signal to use to calculate the correction value in order to remove the carrier leak and image. Therefore, the optimum correction value can be calculated when the upper-level apparatus provides a transmission signal, and the correction value can flexibly be calculated from the test signal when the upper-level apparatus does not provide a transmission signal.

A distortion compensation amplification device according to a first embodiment of the invention will be described in detail with reference to the drawings.

Figure 2:
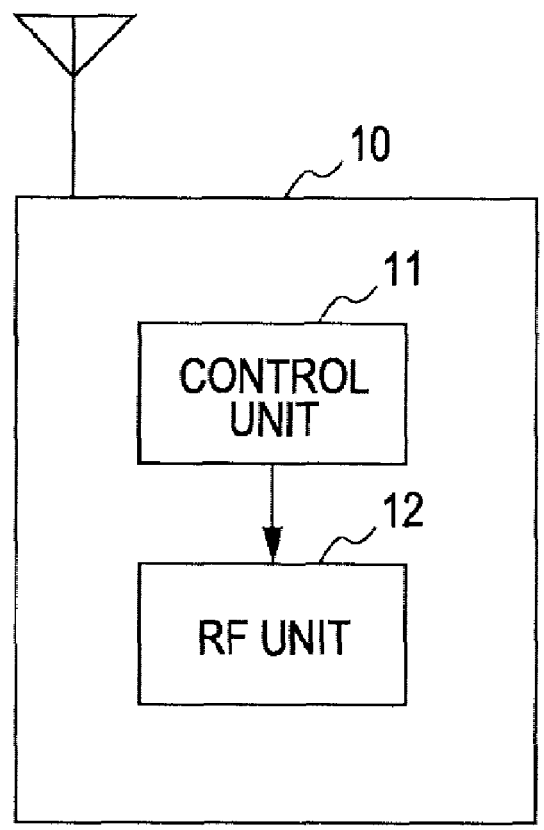
FIG. 2 illustrates a wireless system of a base transceiver station and a terminal which includes a distortion compensation amplification device according to a first embodiment.

FIG. 2 illustrates a wireless system of a base transceiver station and a terminal which includes the distortion compensation amplification device of the first embodiment. FIG. 2 illustrates a base transceiver station 10 and a terminal 20. For example, the terminal 20 is a wireless terminal such as a portable telephone. The base transceiver station 10 includes a control unit 11 and an RF (Radio Frequency) unit 12.

The control unit 11 of the base transceiver station 10 controls the RF unit 12. For example, the control unit 11 provides an instruction to start wireless communication to the RF unit 12 when starting up or re-starting the RF unit 12. The RF unit 12 starts wireless communication with the terminal 20 in response to the start instruction from the control unit 11.

The RF unit 12 has a function of conducting the wireless communication with the terminal 20. Although not illustrated in FIG. 2, the RF unit 12 converts data, transmitted from an upper-level apparatus such as an RNC (Radio Network Control), which controls the base transceiver station 10, into a radio signal to wirelessly transmit the radio signal to the terminal 20. The RF unit 12 also converts the radio signal wirelessly transmitted from the terminal 20 into data that is transmitted to the RNC.

For the base transceiver station, the RNC can be cited as an example of an upper-level apparatus. However, the upper-level apparatus is not limited to an RNC, rather, it is only necessary that the transmission signal (input signal) fed into the distortion compensation amplification device be a baseband signal having amplitude information. Therefore, for the terminal, the transmission signal transmitted from the upper-level apparatus can be replaced by the baseband signal (input signal) fed into the distortion compensation amplification device.

The RF unit 12 includes the distortion compensation amplification device. The distortion compensation amplification device includes an amplifier which amplifies the signal that is wirelessly transmitted to the terminal 20, and compensates for the signal distortion generated by the amplifier.

In the radio signal, the carrier leak and the image are generated by an offset of IQ data in a converter or the incomplete amplitude. The distortion compensation amplification device corrects the IQ data in order to remove the carrier leak and image which are generated in the radio signal.

Figure 3:
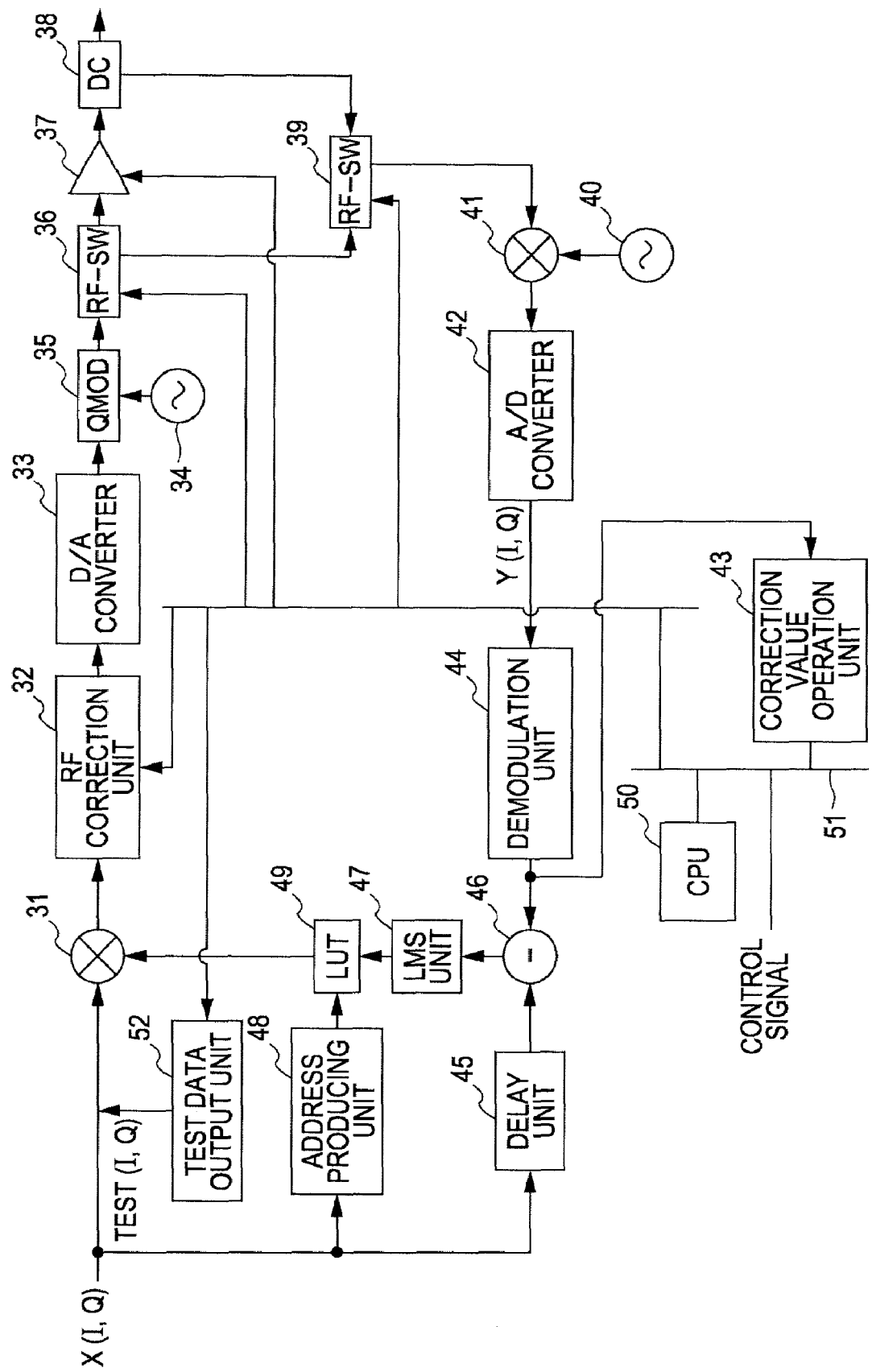
FIG. 3 is a block diagram illustrating the distortion compensation amplification device.

FIG. 3 is a block diagram illustrating the distortion compensation amplification device. Referring to FIG. 3, the distortion compensation amplification device includes a multiplier 31, an RF correction unit 32, a D/A (Digital to Analog) converter 33, oscillators 34 and 40, a QMOD (Quadrature MODulator) 35, RF-SWs (SWitches) 36 and 39, an amplifier 37, a DC (Directional Coupler) 38, a frequency conversion unit 41, an A/D (Analog to Digital) converter 42, a correction value operation unit 43, a demodulation unit 44, a delay unit 45, a subtractor 46, an LMS (Least Mean Square) unit 47, an address producing unit 48, an LUT (Look Up Table) 49, a CPU (Central Processing Unit) 50, a bus 51, and a test data output unit 52.

One of baseband data X(I,Q), supplied from the upper-level apparatus, or test data TEST(I,Q), supplied from the test data output unit 52, is fed into multiplier 31. Baseband data X(I,Q) is user data which is to be wirelessly transmitted to terminal 20. Test data TEST(I,Q) is data that is used to calculate a correction value to remove the carrier leak and image. Because baseband data X(I,Q) and test data TEST(I,Q) are similarly processed in each unit of FIG. 3, only the processing of baseband data X(I,Q) will be described below. A method for using test data TEST(I,Q) will be described in an operation of the distortion compensation amplification device.

Multiplier 31 multiplies baseband data X(I,Q) by a distortion compensation coefficient supplied from LUT 49, and supplies the product to RF correction unit 32. That is, multiplier 31 performs distortion compensation processing on the baseband data X(I,Q).

Under the control of CPU 50, RF correction unit 32 corrects baseband data X(I,Q) supplied from multiplier 31 in order to remove the carrier leak and image generated in QMOD 35.

For example, in the modulation performed by QMOD 35, the carrier leak and image are generated by the offset of the baseband data X(I,Q), imbalance of the IQ amplitude, and a shift of an orthogonal degree of the IQ data. RF correction unit 32 adds an offset value to baseband data X(I,Q) supplied from multiplier 31 in order to remove the offset, and multiplies baseband data X(I,Q) by a coefficient such that the balance of the IQ amplitude becomes identical (one-to-one). RF correction unit 32 adjusts a phase such that the orthogonal degree of the IQ data becomes 90 degrees, and corrects the carrier leak and image of baseband data X(I,Q), which are generated in QMOD 35.

D/A converter 33 converts baseband data X(I,Q) into an analog baseband signal to supply the baseband signal to RF-SW 36.

QMOD 35 converts a frequency of the baseband signal into a radio frequency using a signal supplied from oscillator 34, and supplies the radio frequency to amplifier 37.

Under the control of CPU 50, RF-SW 36 supplies the signal supplied from QMOD 35 to one of either amplifier 37 or RF-SW 39.

Amplifier 37 amplifies the signal supplied from RF-SW 36, and supplies the signal to an antenna (not illustrated). Under the control of CPU 50, amplifier 37 either supplies or does not supply the amplified signal (for example, output amplitude is decreased to zero), or turns on or off the output. A signal component supplied from amplifier 37 will be described below.

Figure 4:
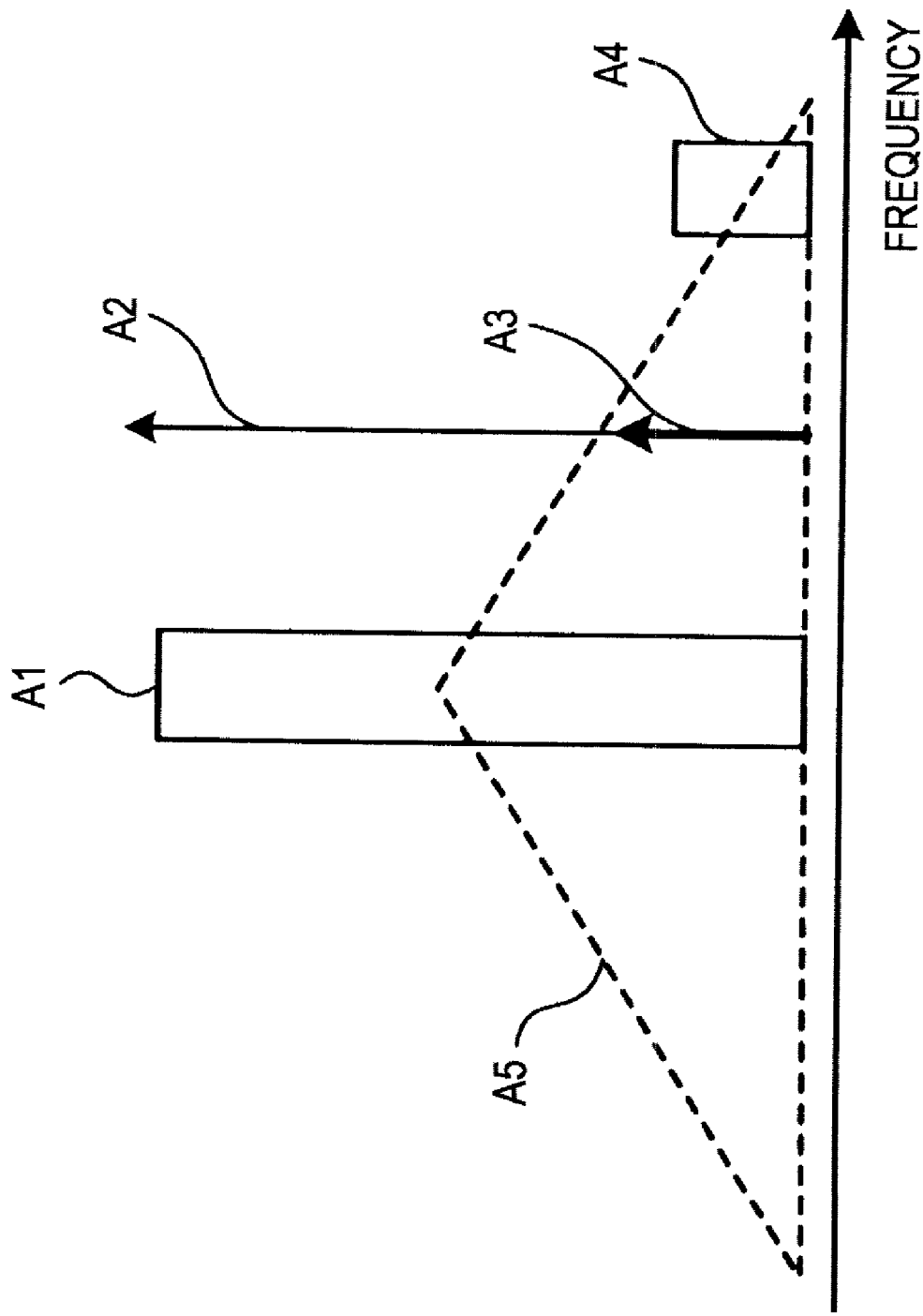
FIG. 4 is a view explaining a carrier leak, an image, and a signal distortion.

FIG. 4 is a view depicting the carrier leak, the image, and the signal distortion. Referring to FIG. 4, rectangle A1 represents a signal component (main signal) transmitted to the terminal 20, arrow A2 represents a carrier component (signal component of oscillator 34), arrow A3 represents a carrier leak, rectangle A4 represents an image of the main signal, and arrow A5 represents a distortion component of the main signal. The carrier leak and the image of the main signal are generated during the modulation of QMOD 35. The distortion component of the main signal is generated during the amplification of amplifier 37.

The carrier leak and the image of the main signal are corrected by RF correction unit 32, and the distortion component of the main signal is compensated by the distortion compensation coefficient of LMS unit 47 or LUT 49. Therefore, amplifier 37 supplies and wirelessly transmits only the target main signal component to terminal 20.

Referring to FIG. 3, DC 38 partially splits the signal supplied from amplifier 37, and supplies the partially split signal to RF-SW 39.

Under the control of CPU 50, RF-SW 39 switches between the signal supplied from DC 38 and the signal supplied from RF-SW 36, and supplies the switched signal to frequency conversion unit 41. That is, either the signal that is passed through amplifier 37 or the signal that is not passed through amplifier 37 is fed as a feedback signal into frequency conversion unit 41.

Using the signal supplied from oscillator 40, frequency conversion unit 41 down-converts the frequency of the signal supplied from RF-SW 39 into a frequency at which A/D converter 42 can perform sampling processing. Frequency conversion unit 41 supplies the down-converted signal to A/D converter 42.

A/D converter 42 converts the feedback signal supplied from frequency conversion unit 41 into a digital feedback signal and supplies the digital feedback signal to demodulation unit 44.

Correction value operation unit 43 calculates a correction value in order to correct the signal in RF correction unit 32 based on the digital feedback signal supplied from demodulation unit 44. As described above, correction value operation unit 43 calculates the offset value for removing the offset, the coefficient for establishing balance of the IQ amplitude, and the phase value for setting the orthogonal degree of IQ data at 90 degrees.

Demodulation unit 44 demodulates the analog signal into baseband data. The analog signal is supplied from A/D converter 42 and is modulated by QMOD 35.

Delay unit 45 delays baseband data X(I,Q) fed into the distortion compensation amplification device, and supplies delayed baseband data X(I,Q) to subtractor 46. For example, delay unit 45 is an n-tap delay filter which can delay baseband data X(I,Q) with an accuracy of 1/n time of a circuit operation clock frequency. Therefore, the timing of baseband data X(I,Q) that is fed into the distortion compensation amplification device is matched with the timing of the delayed feedback signal supplied from the demodulation unit 44.

Subtractor 46 calculates a difference between baseband data X(I,Q) supplied from delay unit 45 and the feedback signal supplied from demodulation unit 44, and supplies the difference to LMS unit 47.

LMS unit 47 updates the distortion compensation coefficient of LUT 49 based on LMS data such that the difference output from subtractor 46 becomes zero. That is, the distortion compensation amplification device multiplies the distortion compensation coefficient from LUT 49 by the fed baseband data X(I,Q), and supplies the product to amplifier 37. LMS unit 47 updates the distortion compensation coefficient in LUT 49 through adaptive signal processing of LMS data such that the difference between fed baseband data X(I,Q) and the feedback signal supplied from amplifier 37 becomes zero.

Address producing unit 48 produces an address corresponding to an electric power (I2+Q2) of baseband data X(I,Q).

The distortion compensation coefficient is stored in LUT 49, which supplies the distortion compensation coefficient to multiplier 31 according to the address supplied from address producing unit 48. LUT 49 stores the distortion compensation coefficient updated by LMS unit 47 in the address specified by address producing unit 48. For example, LUT 49 may be formed by a memory device such as RAM (Random Access Memory).

CPU 50 is connected to RF correction unit 32, RF-SWs 36 and 39, amplifier 37, correction value operation unit 43, and test data output unit 52 through bus 51. CPU 50 is also connected to control unit 11 of FIG. 2.

CPU 50 transmits the correction value calculated by correction value operation unit 43 to RF correction unit 32. CPU 50 controls the output switch of RF-SWs 36 and 39 and the signal output of amplifier 37. CPU 50 controls the output of test data TEST(I,Q) from test data output unit 52.

Under the control of CPU 50, test data output unit 52 supplies test data TEST(I,Q) in order to calculate the correction value with correction value operation unit 43. Therefore, when the distortion compensation amplification device calculates the correction value in order to remove the carrier leak and the image, the distortion compensation amplification device can calculate the correction value using test data TEST (I,Q) even if the upper-level apparatus does not transmit baseband data X(I,Q).

Figure 5:
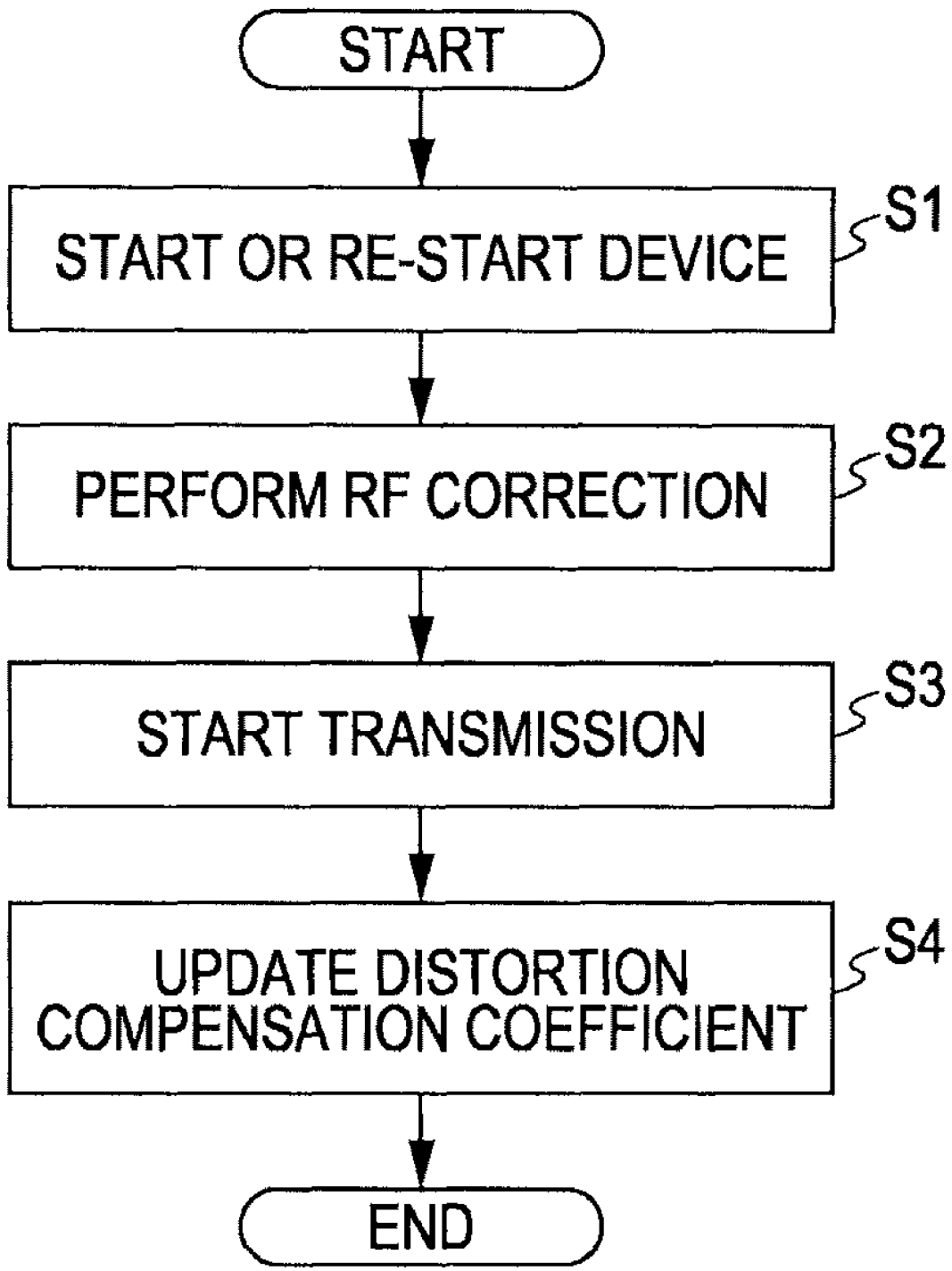
FIG. 5 is a flowchart illustrating an operation of the distortion compensation amplification device.

Operation of the distortion compensation amplification device will be described with reference to a flowchart. FIG. 5 is a flowchart illustrating the operation of the distortion compensation amplification device. In Step S1, the distortion compensation amplification device (RF unit 12) is started up or restarted.

In Step S2, CPU 50 performs the RF correction at the start-up or restart of the distortion compensation amplification device. That is, CPU 50 performs correction processing to remove the carrier leak and image which are generated in QMOD 35. From transmission start processing in Step S3, the carrier leak and the image are removed from the signal transmitted to terminal 20 using the correction processing.

In Step S3, when receiving a control signal for starting the transmission from the control unit 11, CPU 50 switches the output of amplifier 37 from off to on to start the transmission of the radio signal.

The reason why on-off control is performed for the output of the amplifier 37 is that the unnecessary radio signal is not transmitted until control unit 11 provides the transmission start instruction. The output of amplifier 37 is in the off state during start-up or restart.

In Step S4, the distortion compensation amplification device wirelessly transmits the radio signal to terminal 20 while updating the distortion compensation coefficient.

Figure 6:
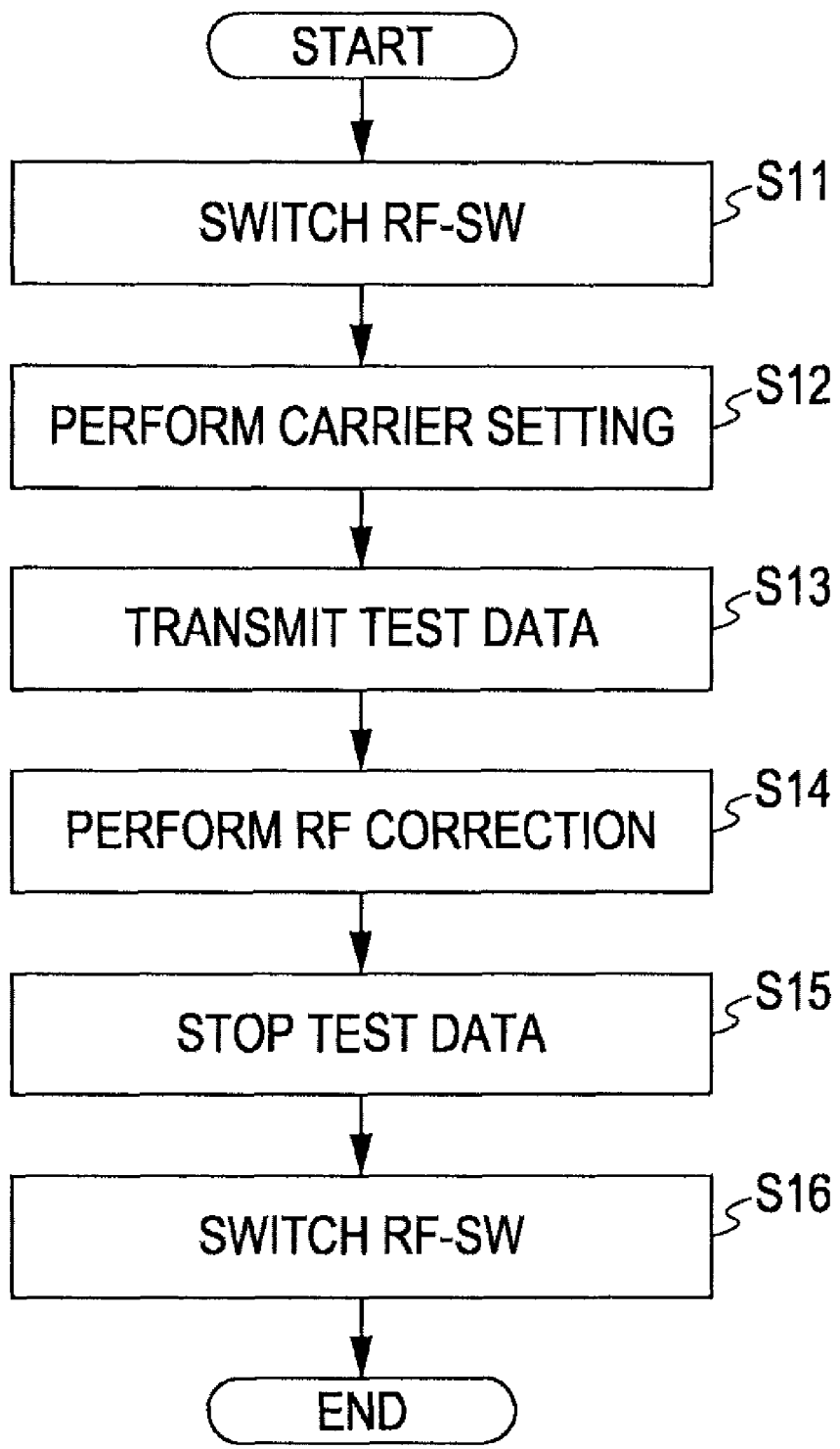
FIG. 6 is a flowchart illustrating detailed processing of RF correction of FIG. 5.

FIG. 6 is a flowchart illustrating detailed processing of the RF correction of FIG. 5. The following processing illustrates the detailed processing in Step S2 of FIG. 5 when the upper-level apparatus does not provide baseband data X(I,Q).

In Step S11, CPU 50 switches RF-SW 36 such that the signal supplied from QMOD 35 is supplied to RF-SW 39. CPU 50 also switches RF-SW 39 so that the signal supplied from RF-SW 36 is supplied to frequency conversion unit 41.

In Step S12, CPU 50 performs carrier setting. The distortion compensation amplification device can produce plural carriers so as to be able to wirelessly transmit baseband data X(I,Q) with plural carriers. CPU 50 sets the carrier used in the base transceiver station 10.

In Step S13, because the upper-level apparatus does not transmit baseband data X(I,Q), CPU 50 controls test data output unit 52 to supply test data TEST(I,Q) to multiplier 31. Test data TEST(I,Q) is fed back to frequency conversion unit 41 by the switching in Step S11 while not amplified by amplifier 37.

In Step S14, correction value operation unit 43 calculates the correction value to remove the carrier leak and image based on the fed-back test data TEST (I,Q). CPU 50 supplies the correction value calculated by correction value operation unit 43 to RF correction unit 32.

Therefore, RF correction unit 32 performs processing on baseband data X(I,Q) supplied from multiplier 31 using the offset value for removing the carrier leak and image generated in QMOD 35, the coefficient for establishing the balance of the IQ amplitude, and the phase value for setting the orthogonal degree of IQ data at 90 degrees.

In Step S15, CPU 50 stops the output of test data TEST(I, Q).

In Step S16, CPU 50 switches RF-SW 36 such that the signal supplied from QMOD 35 is supplied to amplifier 37. CPU 50 also switches RF-SW 39 such that the signal supplied from amplifier 37 is supplied to frequency conversion unit 41.

Therefore, RF correction unit 32 can perform the correction to remove the carrier leak and image, and the transmission start processing in Step S3 of FIG. 5 is performed.

In the case where the upper-level apparatus transmits baseband data X(I,Q), CPU 50 causes test data output unit 52 to not supply test data TEST(I,Q) in Step S13. At this point, baseband data X(I,Q) from the upper-level apparatus is fed back to frequency conversion unit 41 without supplying baseband data X(I,Q) to amplifier 37 by the switching of RF-SWs 36 and 39 in Step S11, and correction value operation unit 43 calculates the correction value based on baseband data X(I, Q).

An operation of a distortion compensation amplification device which does not include RF-SWs 36 and 39 will be described below. That is, the operation of a distortion compensation amplification device, in which the output of QMOD 35 of FIG. 3 is directly connected to an input of amplifier 37 and the signal supplied from amplifier 37 is fed back to frequency conversion unit 41 by DC 38, will be described.

Figure 7:
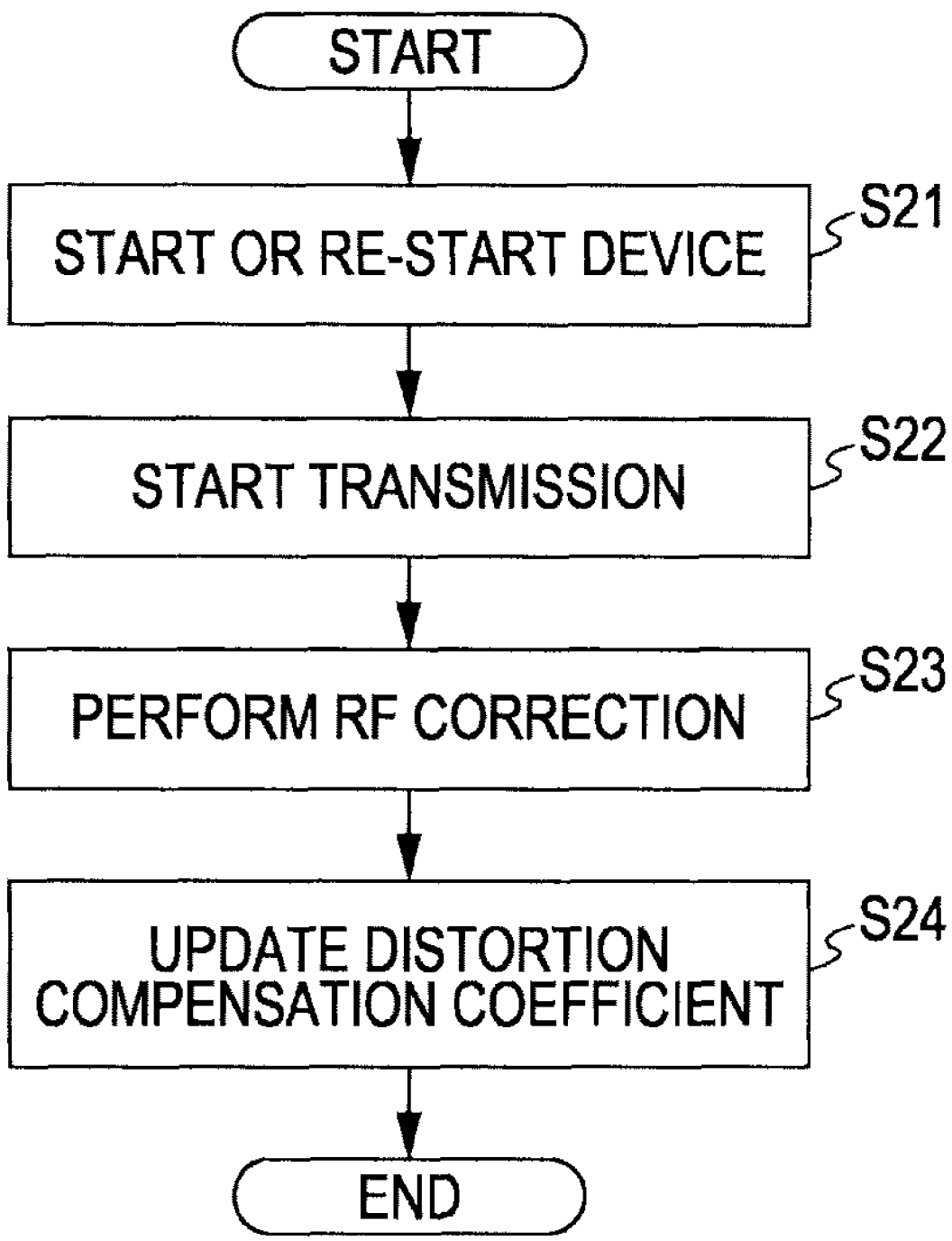
FIG. 7 is a flowchart illustrating an operation of a distortion compensation amplification device which does not include RF-SW.

FIG. 7 is a flowchart illustrating the operation of a distortion compensation amplification device which does not include RF-SWs.

In Step S21, the distortion compensation amplification device is started up or restarted.

In Step S22, CPU 50 switches the output of the amplifier 37 from off to on upon receiving the control signal for starting the transmission from the control unit 11.

In Step S23, the distortion compensation amplification device performs the RF correction.

At this point, in the distortion compensation amplification device which does not include RF-SWs 36 and 39, as described above, the output of amplifier 37 is fed back to frequency conversion unit 41 by DC 38. Accordingly, the distortion compensation amplification device cannot perform the RF correction processing unless the output of amplifier 37 is turned on through the transmission start processing in Step S22. That is, in the distortion compensation amplification device which does not include RF-SWs 36 and 39, the RF correction cannot be performed unless control unit 11 provides the transmission start instruction.

In Step S24, the distortion compensation amplification device wirelessly transmits the radio signal to terminal 20 while updating the distortion compensation coefficient.

Compared with the processing of FIG. 5, in the processing of FIG. 7, after the transmission start instruction (processing in Step S22) is received from control unit 11 to perform the RF correction, the distortion compensation coefficient update processing is performed. That is, in the distortion compensation amplification device which does not include RF-SWs 36 and 39, the flow cannot go immediately to the distortion compensation coefficient update processing even though the transmission start instruction is received from the control unit 11. On the other hand, in the distortion compensation amplification device including RF-SWs 36 and 39, as illustrated in FIG. 5, the flow can go immediately to the distortion compensation coefficient update processing once the transmission start instruction is received from the control unit 11. Therefore, in the distortion compensation amplification device including RF-SWs 36 and 39, the transmission start of the radio signal to which the distortion compensation is performed can be shortened by several seconds relative to the distortion compensation amplification device which does not include RF-SWs 36 and 39.

In a distortion compensation amplification device which does not include RF-SWs 36 and 39, the RF correction is performed after the transmission start processing as illustrated in Step S22 of FIG. 7. Accordingly, immediately after the transmission starts (until the RF correction is completed), the carrier leak and the image are included in the radio signal transmitted to terminal 20, and in-band spurious signals are generated. On the other hand, in the distortion compensation amplification device including RF-SWs 36 and 39, because the transmission start processing is performed after the RF correction as illustrated in Step S3 of FIG. 5, in-band spurious signals are not generated.

In the distortion compensation amplification device which does not include RF-SWs 36 and 39, the RF correction processing is performed using the feedback signal in which amplifier 37 is located along the path. Therefore, the feedback signal includes a slight amount of the distortion component, and the error component of the feedback signal impairs correction accuracy. On the other hand, in the distortion compensation amplification device including RF-SWs 36 and 39, correction accuracy is not impaired because the RF correction processing is performed using the feedback signal in which amplifier 37 is not located along the path.

Thus, the distortion compensation amplification device of the first embodiment calculates the correction value to remove the carrier leak and the image based on baseband data X(I,Q) transmitted from the upper-level apparatus, and supplies test data TEST(I,Q) to calculate the correction value in order to remove the carrier leak and the image when the upper-level apparatus does not provide baseband data X(I,Q). Therefore, the optimum correction value can be calculated when the upper-level apparatus provide transmission data, and the correction value can flexibly be calculated using test data when the upper-level apparatus does not provide transmission data.

In particular, the carrier leak component in QMOD 35 has an output level characteristic, and the optimum value of the amount of carrier leak correction depends on the fed signal level. Therefore, the correction value is calculated using the actual baseband data X(I,Q), so that the correction can be performed with high accuracy.

Alternatively, CPU 50 may produce test data TEST(I,Q) using a program to supply test data TEST(I,Q) to multiplier 31. Test data TEST(I,Q) may alternatively be fed into multiplier 31 from the outside.

In the case where secure performance of the high-accuracy correction is required, CPU 50 can also make a request for transmission of baseband data X(I,Q) to control unit 11. Control unit 11 makes a request for transmission of baseband data X(I,Q) to the upper-level apparatus in response to the transmission request from CPU 50. CPU 50 transmits a completion signal to control unit 11 when the RF correction is completed using baseband data X(I,Q). Control unit 11 transmits a control signal for starting the transmission to CPU 50 upon receiving the notification of the RF correction completion from CPU 50.

Although CPU 50 controls the switching of RF-SWs 36 and 39, the output paths of RF-SWs 36 and 39 may be manually switched.

CPU 50 supplies the correction value calculated by correction value operation unit 43 to RF correction unit 32. Alternatively, correction value operation unit 43 may directly supply the correction value to RF correction unit 32.

CPU 50 may alternatively perform the processing of correction value operation unit 43 using a program.

A distortion compensation amplification device according to a second embodiment of the invention will be described in detail with reference to the drawings. The QMOD has a linear output unlike the amplifier. Accordingly, in the RF correction, it is not necessary to multiply the distortion compensation coefficient by the baseband data and the test data. Therefore, in the second embodiment, a signal detour is provided in the multiplier which performs the multiplication of the distortion compensation coefficient.

Figure 8:
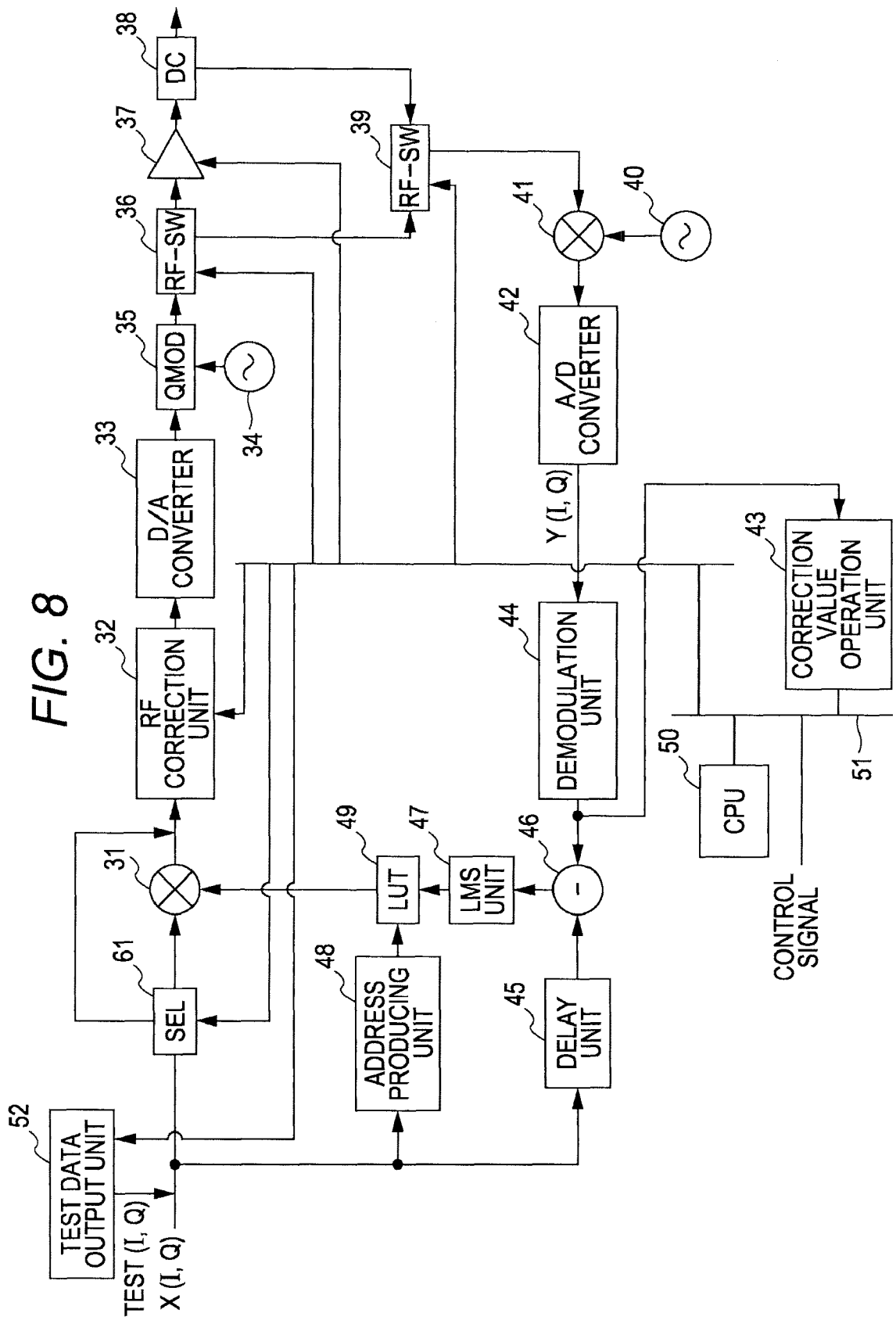
FIG. 8 is a block diagram illustrating a distortion compensation amplification device according to a second embodiment.

FIG. 8 is a block diagram illustrating the distortion compensation amplification device of the second embodiment. In FIG. 8, the same components as in FIG. 3 are designated by the same numerals, and the description of these components is omitted.

In FIG. 8, SEL (selector) 61 is provided in front of multiplier 31. Under the control of CPU 50, SEL 61 feeds either baseband data X(I,Q) or test data TEST(I,Q) into multiplier 31, and feeds either baseband data X(I,Q) or test data TEST(I,Q) into RF correction unit 32.

Because QMOD 35 has a linear output characteristic, it is not necessary to perform distortion compensation on baseband data X(I,Q) or test data TEST(I,Q) when the RF correction is performed. Accordingly, when the RF correction is performed, either baseband data X(I,Q) or test data TEST(I,Q) is fed into RF correction unit 32 while multiplier 31 is not located along the path.

For example, in performing the RF correction in Step S2 of FIG. 5, CPU 50 switches SEL 61 such that either baseband data X(I,Q) or test data TEST(I,Q) is fed into RF correction unit 32. In performing the transmission start processing in Step S3, CPU 50 switches SEL 61 such that either baseband data X(I,Q) or test data TEST(I,Q) is fed into multiplier 31 to multiply the distortion compensation coefficient by either baseband data X(I,Q) or test data TEST(I,Q). Other portions of the processing of the second embodiment are similar to those of the first embodiment.

It is not necessary to perform the distortion compensation processing in calculating the correction value of the RF correction, so that either baseband data X(I,Q) or test data TEST(I,Q) is detoured from multiplier 31. Therefore, in calculating the correction value, the operation of the portion which performs the distortion compensation coefficient (demodulation unit 44, delay unit 45, subtractor 46, LMS unit 47, address producing unit 48, and LUT 49) can be turned off to reduce the power consumption.

A distortion compensation amplification device according to a third embodiment of the invention will be described in detail with reference to the drawings. In the second embodiment, the signal detour is provided in the multiplier which performs the multiplication of the distortion compensation coefficient, and the distortion compensation coefficient is not multiplied by the data. In the third embodiment, a coefficient of 1+j0 is multiplied by the data to eliminate the multiplication of the distortion compensation coefficient.

Figure 9:
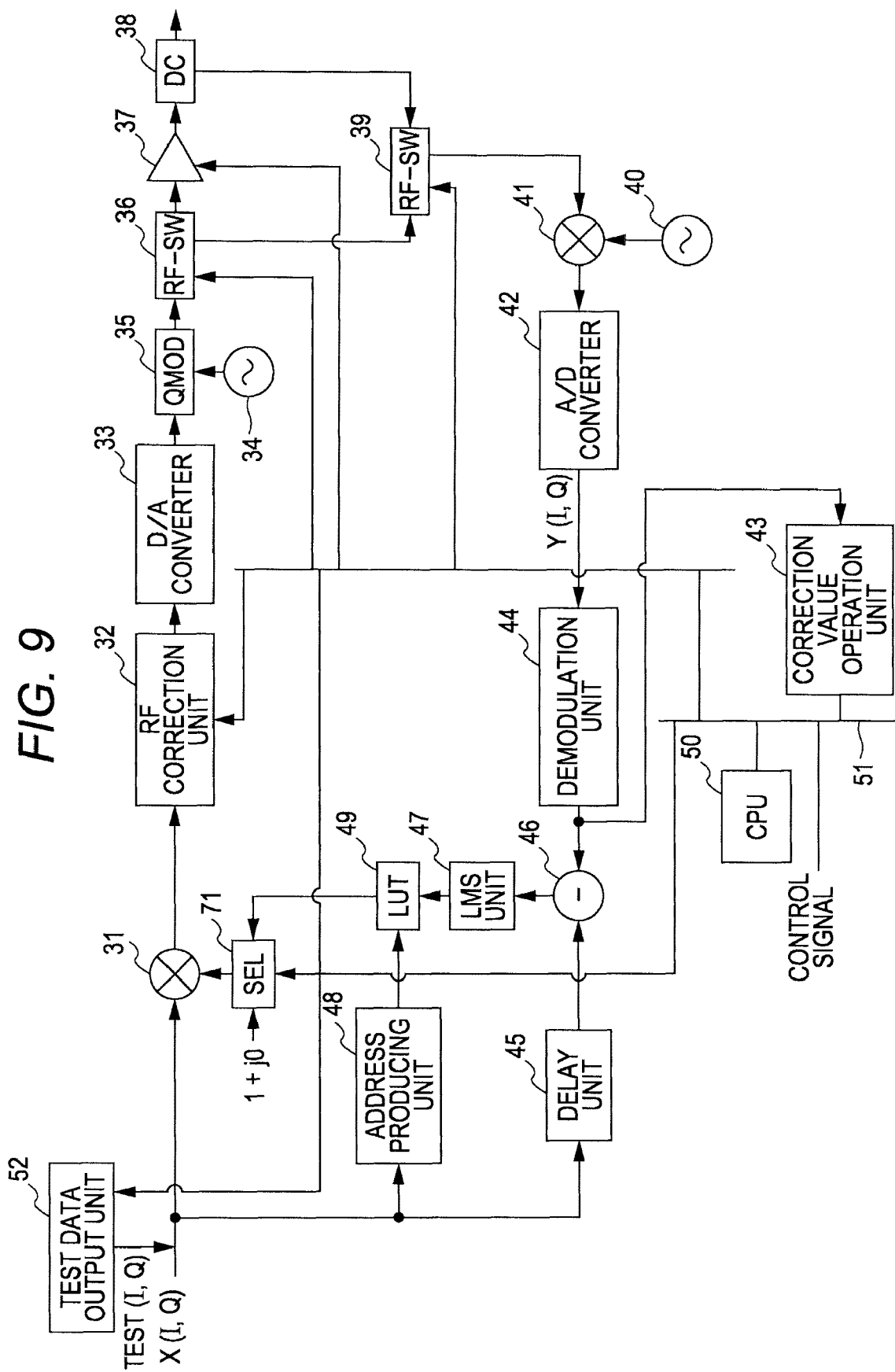
FIG. 9 is a block diagram illustrating a distortion compensation amplification device according to a third embodiment.

FIG. 9 is a block diagram illustrating the distortion compensation amplification device of the third embodiment. In FIG. 9, the same components as in FIG. 3 are designated by the same numerals, and the description of these components is omitted.

In FIG. 9, SEL 71 is provided between LUT 49 and multiplier 31. The distortion compensation coefficient supplied from LUT 49 is fed into SEL 71, and the coefficient of 1+j0 is fed into SEL 71. Under the control of CPU 50, SEL 71 supplies either the fed coefficient of 1+j0 or the distortion compensation coefficient of LUT 49 to multiplier 31.

Baseband data X(I,Q) and test data TEST(I,Q) are not changed even if multiplier 31 multiplies the coefficient of 1+j0 by baseband data X(I,Q) or test data TEST(I,Q). That is, the coefficient of 1+j0 is a coefficient which directly supplies the fed baseband data X(I,Q) and test data TEST(I,Q) to RF correction unit 32.

Because QMOD 35 has a linear output characteristic, it is not necessary to perform the distortion compensation on baseband data X(I,Q) or test data TEST(I,Q) when the RF correction is performed. Accordingly, when the RF correction is performed, the coefficient of 1+j is multiplied by baseband data X(I,Q) or test data TEST(I,Q).

For example, in performing the RF correction in Step S2 of FIG. 5, CPU 50 switches SEL 71 such that the coefficient of 1+j0 is multiplied by either baseband data X(I,Q) or test data TEST(I,Q). In performing the transmission start processing in Step S3, CPU 50 switches SEL 71 such that the distortion compensation coefficient supplied from LUT 49 is multiplied by either baseband data X(I,Q) or test data TEST(I,Q). Other portions of the processing of the third embodiment are similar to those of the first embodiment.

It is not necessary to perform the distortion compensation processing in calculating the correction value of the RF correction, so that the coefficient of 1+j0 is multiplied by either baseband data X(I,Q) or test data TEST(I,Q). Therefore, in calculating the correction value, the operation of the portion of the device that performs the distortion compensation coefficient processing can be turned off to reduce the power consumption.

In FIG. 9, SEL 71 switches between the distortion compensation coefficient of LUT 49 and the coefficient of 1+j0. Alternatively, the distortion compensation coefficient stored in LUT 49 is stored in a nonvolatile memory, and the distortion compensation coefficient of LUT 49 may be rewritten by the coefficient of 1+j0. When the calculation of the compensation value is completed in correction value operation unit 43, CPU 50 returns the distortion compensation coefficient stored in the nonvolatile memory to LUT 49. SEL 71 is omitted in this configuration.

In the disclosed device, the correction value can be calculated optimally and flexibly in order to remove the carrier leak and the image.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A distortion compensation amplification device to supply a transmission signal while a distortion of the amplified transmission signal is compensated, the distortion compensation amplification device comprising:
    a correction unit to correct a carrier leak and an image of the transmission signal based on a correction value;
    a modulation unit to modulate the transmission signal supplied from the correcting unit;
    a correction value calculating unit to calculate the correction value based on the transmission signal supplied from the modulation unit; and
    a test signal output unit to supply a test signal to the correction unit in order to calculate the correction value of the correction value calculating unit when the transmission signal is not transmitted; and
    an amplifying unit to amplify the transmission signal supplied from the modulation unit, wherein
    an output of the amplifying unit is turned off while the correction value calculating unit calculates the correction value.

2. The distortion compensation amplification device according to claim 1, further comprising an output switching unit to supply the transmission signal supplied from the modulation unit to either the correction value calculating unit or the amplifying unit.

3. The distortion compensation amplification device according to claim 2, wherein the output switching unit switches an output destination of the transmission signal to the amplifying unit when calculation of the correction value is completed in the correction value calculating unit, and
    the amplifying unit turns on the output of the amplified transmission signal.

4. The distortion compensation amplification device according to claim 1, further comprising:
    a distortion compensation processing unit in front of the correction unit to perform distortion compensation processing to the transmission signal; and
    a transmission signal path switching unit to supply the transmission signal to the correction unit while the transmission signal is not passed through the distortion compensation processing unit.

5. The distortion compensation amplification device according to claim 4, wherein the transmission signal path switching unit supplies the transmission signal to the correction unit while the transmission signal is not passed through the distortion compensation processing unit, while the correction value calculating unit calculates the correction value.

6. The distortion compensation amplification device according to claim 1, further comprising a distortion compensation processing unit in front of the correction unit to perform distortion compensation processing to the transmission signal, the distortion compensation processing unit supplying the transmission signal to the correction unit.

7. The distortion compensation amplification device according to claim 6, wherein the distortion compensation processing unit performs the distortion compensation processing to the transmission signal when the correction value calculating unit completes calculation of the correction value, the distortion compensation processing directly supplying the transmission signal to the modulation unit.

8. The distortion compensation amplification device according to claim 1, further comprising a transmission request unit which makes a request for transmission of the transmission signal when the correction value calculating unit completes calculation of the compensation value.

9. A method for correcting a carrier leak and an image in a distortion compensation amplification device which supplies a transmission signal while a distortion of the amplified transmission signal is compensated, the method comprising:
    supplying a test signal when the transmission signal is not transmitted; and
    calculating a correction value to remove the carrier leak and the image of the transmission signal based on the transmission signal when the transmission signal is transmitted or based on the test signal when the transmission signal is not transmitted; and
    turning off an output of an amplifier which amplifies the transmission signal while the correction value is calculated.

* * * * *